US 9,250,816 B2

(12) United States Patent
Dai et al.

(10) Patent No.: US 9,250,816 B2
(45) Date of Patent: Feb. 2, 2016

(54) ADAPTIVE REFERENCE TUNING FOR ENDURANCE ENHANCEMENT OF NON-VOLATILE MEMORIES

(71) Applicant: International Business Machines Corporation, Armonk, NY (US)

(72) Inventors: Bing Dai, Ossining, NY (US); Chung H. Lam, Peekskill, NY (US); Jing Li, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 14/013,485

(22) Filed: Aug. 29, 2013

(65) Prior Publication Data

US 2014/0281162 A1  Sep. 18, 2014

Related U.S. Application Data

(63) Continuation of application No. 13/842,375, filed on Mar. 15, 2013, now Pat. No. 9,122,404.

(51) Int. Cl.
*G06F 12/00* (2006.01)
*G06F 3/06* (2006.01)

(52) U.S. Cl.
CPC ............ *G06F 3/0616* (2013.01); *G06F 3/0653* (2013.01); *G06F 3/0688* (2013.01)

(58) Field of Classification Search
None
See application file for complete search history.

(56) References Cited

U.S. PATENT DOCUMENTS 6,732,221 B2    5/2004  Ban

OTHER PUBLICATIONS

Kgil, T. et al., "Improving Nand Flash Based Disk Caches" ISCA '08: Proceedings of the 35th Annual International Symposium on Computer Architechture (Jun. 2008) pp. 327-338, vol. 36, No. 3.

*Primary Examiner* — Midys Rojas
(74) *Attorney, Agent, or Firm* — Scully, Scott, Murphy & Presser, P.C.; Louis J. Percello, Esq.

(57) ABSTRACT

A wear leveling technique is employed in a memory device so that the cycling history of a memory block is represented by the cycling history of a representative memory cell or a small number of representative memory cells. A control logic block tracks the cycling history of the one or more representative memory cells. A table tabulating the predicted shift in an optimal value for a reference variable for a sensing circuit as a function of cycling history is provided within the memory device. Prior to sensing a memory cell, the control logic block checks the total number of cycling in the one or more representative memory cells and adjusts the value for the reference variable in the sensing circuit, thereby providing an optimal value for the reference variable in the sensing circuit for each sensing cycle of the memory device.

11 Claims, 8 Drawing Sheets

FIG. 2

| 150 | 250 |
|---|---|
| Cycle range 1 | Ref value 1 |
| Cycle range 2 | Ref value 2 |
| Cycle range 3 | Ref value 3 |
| | |
| | |
| | |
| Cycle range n | Ref value n |

FIG. 5A

| 150 | 250 | | |
|---|---|---|---|
| Cycle range 1 | Ref value 1A | Ref value 1B | Ref value 1C |
| Cycle range 2 | Ref value 2A | Ref value 2B | Ref value 2C |
| Cycle range 3 | Ref value 3A | Ref value 3B | Ref value 3C |
| | | | |
| | | | |
| | | | |
| Cycle range N | Ref value NA | Ref value NB | Ref value NC |

ADAPTIVE REFERENCE TUNING FOR ENDURANCE ENHANCEMENT OF NON-VOLATILE MEMORIES

CROSS REFERENCE TO RELATED APPLICATION

This application is a continuation of U.S. patent application Ser. No. 13/842,375, filed Mar. 15, 2013 the entire content and disclosure of which is incorporated herein by reference.

BACKGROUND

The present disclosure relates to semiconductor circuits, and particularly to a semiconductor circuit including a non-volatile memory and a sensing circuit providing an adaptive reference for sensing, and a method of operating the same.

Non-volatile memory technologies have the potential to provide high-density memory devices in future generations. Non-volatile memory devices provide low cost per bit, permanency (non-volatility) of stored information, and reasonably long lifetime (endurance) as measured by the number of writing cycles. As used throughout the present disclosure, a memory device refers to a device including at least a plurality of memory cells capable of storing one bit of information. As used throughout the present disclosure, "endurance" refers to the average number of write cycles that a non-volatile memory device can provide before a device failure. As used throughout the present disclosure, a "cycling" of a memory cell refers to the event of writing information for a single memory bit on the memory cell. Exemplary non-volatile memory devices include spin torque transfer random access memory (RAM) devices, phase change memory (PCM) devices, and resistive random access memory (RAM) devices.

Non-volatile memories do not provide as high a level of endurance as static random access memory (SRAM) or dynamic random access memory (DRAM) due to the inherent nature of the information storage mechanism. Specifically, the cell state change in a non-volatile memory device requires a change in the resistivity of a material or other physically measurable quantities. In order to utilize non-volatile memory devices in upper hierarchy of memories, e.g., in direct communication with a processor unit as a first level cache or in close communication with the processor unit as a second level or third level cache, the endurance of non-volatile memory technologies needs to be improved beyond the level achieved in present day technology.

SUMMARY

The variations in the distribution of the number of cycling for non-volatile memory cells within a non-volatile memory device is reduced by a wear leveling technique so that the cycling history of a memory block is represented by the cycling history of a representative memory cell or a small number of representative memory cells. A control logic block tracks the cycling history of the one or more representative memory cells. A table tabulating the predicted shift in an optimal value for a reference variable for a sensing circuit as a function of cycling history is provided within the memory device. Prior to sensing a memory cell, the control logic block checks the total number of cycling in the one or more representative memory cells and adjusts the value for the reference variable in the sensing circuit, thereby providing an optimal value for the reference variable in the sensing circuit for each sensing cycle of the memory device.

According to an aspect of the present disclosure, a memory device is provided, which includes a plurality of memory cells, a sensing circuit for determining a state of a selected memory cell among the plurality of memory cells by comparing a value of a measured quantity from the selected memory cell with a variable reference parameter, and a memory controller including at least a control logic block and a look-up table. The control logic block determines an estimated number of cycling for the plurality of memory cells by counting a total number of cycling for at least one memory cell. The look-up table returns a value for the variable reference parameter to the sensing circuit for each value of the total number of cycling provided by the control logic block.

According to another aspect of the present disclosure, a method of operating a memory device is provided. A memory device including a plurality of memory cells, a sensing circuit, a memory controller is provided. The memory controller includes a wear leveling circuit, a control logic block, and a look-up table. The location of data written into the plurality of memory cells is randomized employing the wear leveling circuit. An estimated number of cycling is determined for the plurality of memory cells by counting a total number of cycling for at least one memory cell. The estimated number of cycling is provided to the look-up table. The look-up table returns a value for a variable reference parameter that corresponds to the estimated number of cycling to the sensing circuit. Employing the sensing circuit and the returned value for the variable reference parameter, a state of a selected memory cell among the plurality of memory cells can be determined with enhanced endurance.

DETAILED DESCRIPTION

As stated above, the present disclosure relates to a semiconductor circuit including a non-volatile memory and a sensing circuit providing an adaptive reference for sensing, and a method of operating the same. Aspects of the present disclosure are now described in detail with accompanying figures. It is noted that like and corresponding elements are referred to by like reference numerals.

Figure 1A:
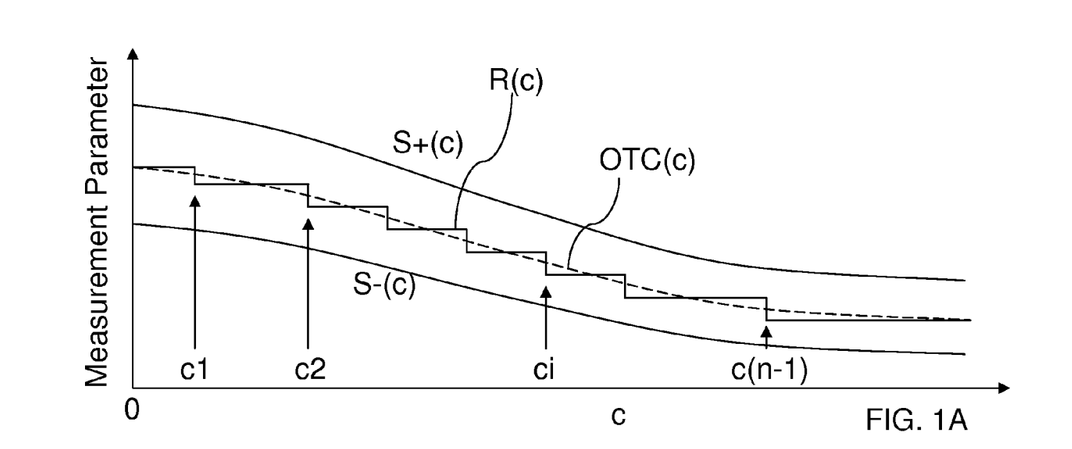
FIG. 1A is an exemplary graph illustrating the cycling dependence of a measurement parameter for a "high" state, a "low" state, an optimal threshold for distinguishing states, and a digitized approximation of the optimal threshold as a function of a total number of cycling according to an embodiment of the present disclosure.
Figure 1B:
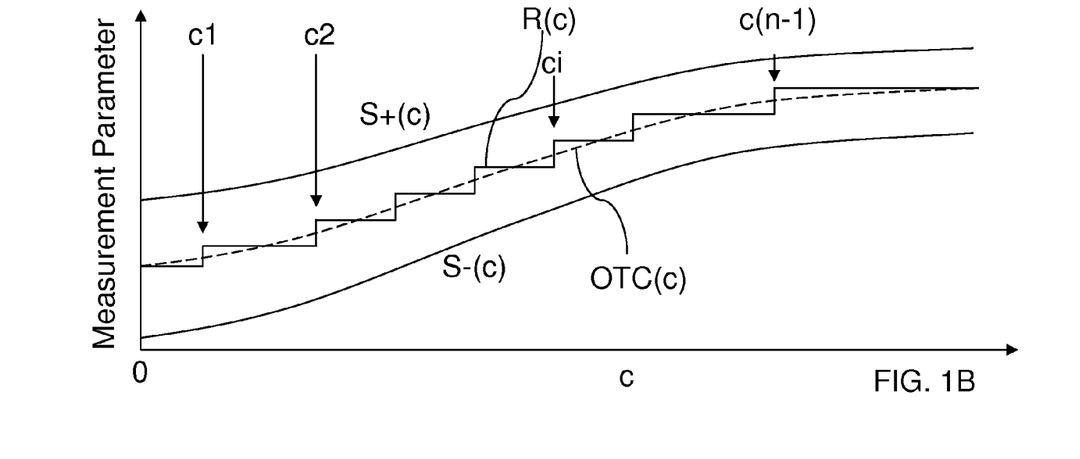
FIG. 1B is another exemplary graph illustrating the cycling dependence of a measurement parameter for a "high" state, a "low" state, an optimal threshold for distinguishing states, and a digitized approximation of the optimal threshold as a function of a total number of cycling according to an embodiment of the present disclosure.

Referring to FIGS. 1A and 1B, exemplary graphs illustrate the cycling dependence of a measurement parameter for a "high" state, a "low" state, an optimal threshold for distinguishing states, and a digitized approximation of the optimal threshold as a function of a total number of cycling c.

As used herein, a "high" state refers to a state of a memory cell having a greater value for a measurement parameter among two possible states of the memory cell that stores, or attempts to store, a bit value. As used herein, a "low" state refers to a state of the memory cell having a lesser value for the measurement parameter among two possible states of the memory cell that stores, or attempts to store, a bit value. A high state stores one of a "0" bit value and a "1" bit value, and a low state stores the other of the "0" bit value and the "1" bit value. As used herein, a "measurement parameter" is a physical variable that is employed to detect the bit value for a memory cell, can be an electrical current, electrical voltage, electrical resistance, magnetoresistance, electrical charge, magnetic flux, etc.

As used herein, a "threshold" for distinguishing states refers to a value or a set of values as a function of the total number of cycling t and/or at least another parameter for the measurement parameter employed to compare a measured value for the measurement parameter for a memory cell against, and to determine the state of the memory cell. An "optimal threshold" refers to an idealized threshold that provides the least error in determining the state of each memory cell among a plurality of memory cells given the statistical variations in the values of the measurement parameter within the plurality of memory cells.

As used herein, a "digitized approximation" is an approximation in which a function having a constant value for each subset of a definition range is substituted for a continuously varying function.

A high-state nominal curve S+(c) represents the cycling dependence of a nominal value for the measurement parameter of the high state of a memory cell, i.e., the dependence of the nominal value for the measurement parameter of the memory cell on the total number of cycling of the memory cell for the high state. In one embodiment, the nominal value for the measurement parameter of the memory cell can be independent of the fraction of times in which a "0" bit value is stored in the memory cell (and thus, be independent of the fraction of times in which a "1" bit value is stored in the memory cell). In another embodiment, the nominal value for the measurement parameter of the memory cell can be calculated assuming a predefined fraction of times in which a "0" bit value is stored in the memory cell (e.g., 50% of the times). In yet another embodiment, the nominal value for the measurement parameter of the memory cell can be calculated assuming a statistical average of programming conditions of the memory cell, i.e., a statistical average of the physical parameters employed for writing data into the memory cell. The high-state nominal curve S+(c) can increase, or decrease, or have another type of dependency as a function the number of cycling c.

A low-state nominal curve S−(c) represents the cycling dependence of a nominal value for the measurement parameter of the low state of a memory cell. In one embodiment, the nominal value for the measurement parameter of the memory cell can be independent of the fraction of times in which a "0" bit value is stored in the memory cell (and thus, be independent of the fraction of times in which a "1" bit value is stored in the memory cell). In another embodiment, the nominal value for the measurement parameter of the memory cell can be calculated assuming a predefined fraction of times in which a "0" bit value is stored in the memory cell (e.g., 50% of the times). In yet another embodiment, the nominal value for the measurement parameter of the memory cell can be calculated assuming a statistical average of programming conditions of the memory cell, i.e., a statistical average of the physical parameters employed for writing data into the memory cell. The low-state nominal curve S−(c) can increase, or decrease, or have another type of dependency as a function the number of cycling c.

It is understood that the value for the measurement parameter for the high state has a distribution at any number of cycling. The nominal value for the measurement parameter of the high state of the memory cell is a statistical quantity that characterizes the distribution of values for the measurement parameter for the high state. For example, the nominal value can be a mathematical mean or a median of the distribution of the measurement parameter of the high state of the memory cell at any give number of cycling.

Likewise, the value for the measurement parameter for the low state has a distribution at any number of cycling. The nominal value for the measurement parameter of the low state of the memory cell is a statistical quantity that characterizes the distribution of values for the measurement parameter for the low state. For example, the nominal value can be a mathematical mean or a median of the distribution of the measurement parameter of the low state of the memory cell at any give number of cycling.

The measurement parameter can be a measured resistance of a memory element in a memory cell, a measured electrical current through a memory element under a fixed applied sensing voltage, a measured electrical voltage across a memory element under a fixed applied sensing current, a measured magnetoresistance under a fixed sensing condition, a measured amount of electrical charge within a memory element under a fixed measurement condition, a measured amount of magnetic flux under a fixed measurement condition, etc. As used herein, a "memory element" is a physical component within a memory cell that changes the state depending on the bit encoded within the memory cell. A memory element can be a block of a material that changes physical, electronic, or magnetic states.

The high-state nominal curve S+(c) and the low-state nominal curve S−(c) can be obtained experimentally, i.e., by testing a memory device embodying a plurality of the memory cells and measuring values for the measurement parameter throughout the course of cycling for the plurality of memory cells.

Figure 2:
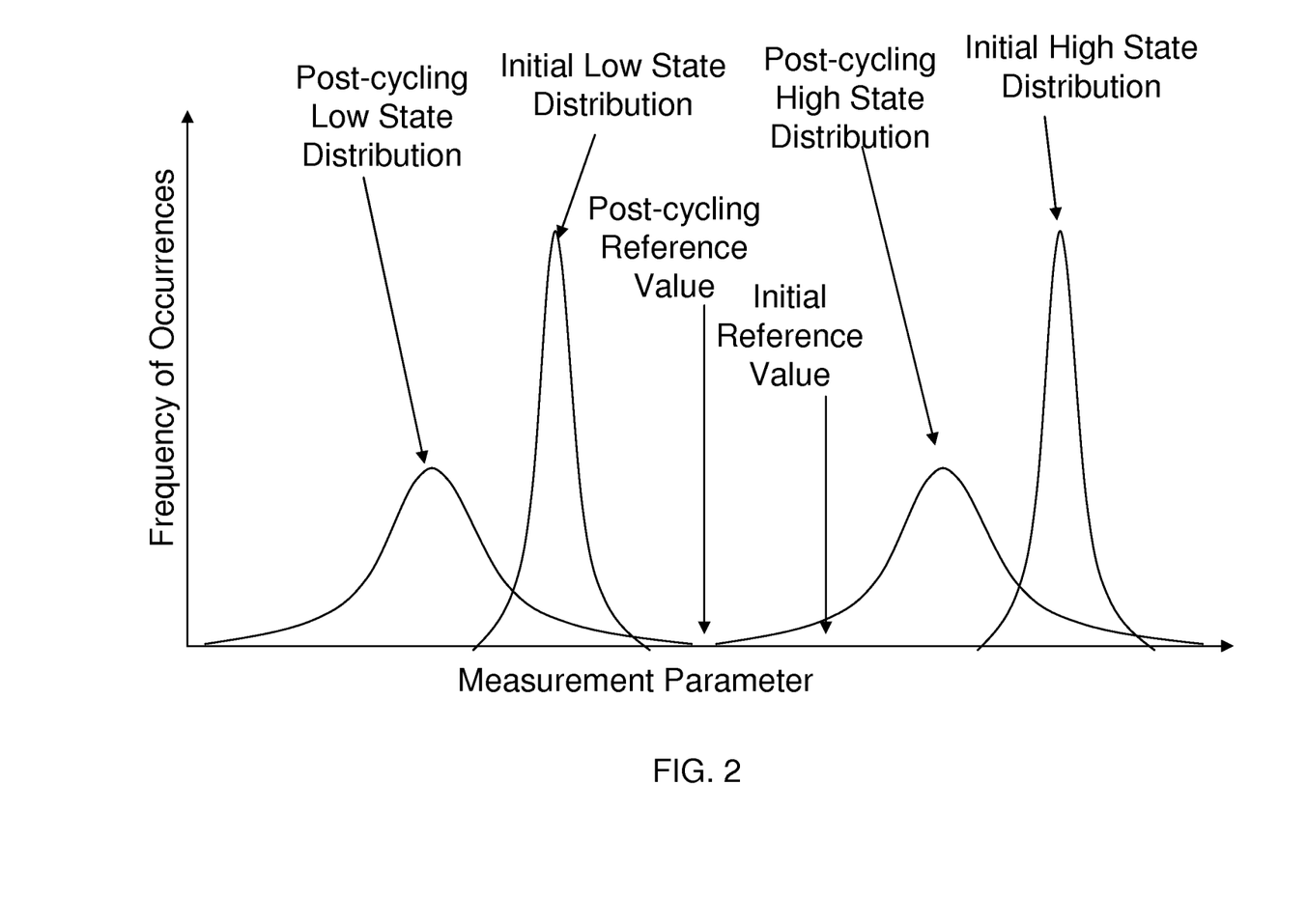
FIG. 2 is a distribution of values of the measurement parameter for the "high" state and the "low" state as measured at initial operation of a memory device and as measured after cycling of the memory device according to an embodiment of the present disclosure.

The distribution of the measurement parameter can broaden with cycling. As illustrated in FIG. 2, the initial distribution of the measurement parameter for the high state (labeled as the "initial high state distribution") and the initial distribution of the measurement parameter for the low state (labeled as the "initial low state distribution") are narrower than corresponding distribution of the measurement parameter after a number of cycling that is large enough to cause shift in the mean of the measurement parameter. The distribution of the measurement parameter for the high state after the cycling is labeled as the "post-cycling high state distribution," and the distribution of the measurement parameter for the low state after the cycling is labeled as the "post-cycling low state distribution."

Corresponding to the shift in the distribution of values of the measurement parameter, the value of the measurement parameter that is most likely to function as a correct threshold value for determining whether a state of a memory cell is the high state or the low state changes with the number of cycling. The value of the measurement parameter that is most likely to function as a correct threshold value is the optimal threshold. The optimal threshold for the first cycling of the memory cell is herein referred to as an "initial reference value," which is the reference value against which a measured value for the measurement parameter of the memory cell can be compared at the first reading of the memory cell that follows the first cycling (writing) of the memory cell. The optimal threshold for the cycling of the memory cell after a number of cycling greater than 1 is herein referred to as a "post-cycling reference value," which is the reference value against which a measured value for the measurement parameter of the memory cell can be compared after the number of cycling that generates the post-cycling high state distribution and the post-cycling low state distribution.

Referring back to FIGS. 1A and 1B, the optimal threshold curve OTC(c) represents a curve at which the probability to erroneously identify a low state for a high state and the probability to erroneously identify a high state for a low state are equal. It is noted that the probability of erroneously identifying states tends to increase with the total number of cycling because of the broadening of the distribution of the measurement parameter with cycling. The optimal threshold curve OTC(c) is a function of the number of cycling c. The optimal threshold curve OTC(c) can be experimentally determined by comparing the distribution of values of the measurement parameter for the high state and the distribution of values of the measurement parameter for the low state as a function of the number of cycling c.

The digitized approximation R(c) of the optimal threshold curve OTC(c) can be obtained by segmenting the optical threshold curve OTC(c) into multiple portions having a range of variation in the value of the measurement parameter that does not exceed a predefined maximum value for a measurement parameter range in the measurement parameter.

In one embodiment, the predefined maximum value for a measurement parameter range in the measurement parameter can be proportional to the difference in the initial values for the high-state nominal curve S+(c) and the low-state nominal curve S−(c). In an illustrative example, the predefined maximum value for a measurement parameter range in the measurement parameter can be 1.0% of the difference between the initial value for the high-state nominal curve S+(c) and the initial value for the low-state nominal curve S−(c).

In another embodiment, the predefined maximum value for a measurement parameter range in the measurement parameter can be selected to be the same as, or as an integer multiple of, the smallest change for the measurement parameter that a sensing circuit configured to measure the measurement parameter can detect. For example, if the measurement parameter is a resistance, and if the sensing circuit has a resolution of 1 m$\Omega$, the predefined maximum value for the measurement parameter range can be 1 m$\Omega$ or an integer multiple thereof.

For each portion of the optimal threshold curve OTC(c) having a range of variation in the value of the measurement parameter and the corresponding range of the number of cycling c, a section of the digitized approximation R(c) corresponding to the same range in the number of cycling c is defined by assigning a value for the measurement parameter to the section of the digitized approximation R(c). The assigned value is within the range of variation in the value of the measurement parameter for the corresponding portion of the optimal threshold curve OTC(c). Thus, the digitized approximation R(c) of the optimal threshold curve OTC(c) approximates the optical threshold curve OTC(c).

Each end of a range of the number of cycling c corresponding to a section of the digitized approximation R(c) having the same value for the measurement parameter are labeled as ci in FIGS. 1A and 1B. For example, the end of the first range of the number of cycling c is labeled c1, the end of the second range of the number of cycling c is labeled c2, and the end of second to last range of the number of cycling c beyond which a constant value is assigned for the measurement parameter within the digitized approximation R(c) is labeled cn.

In one embodiment, the optimal threshold curve OTC(c) can be approximated by a mathematical average of the high-state nominal curve S+(c) and the low-state nominal curve S−(c). In one embodiment, the digitized approximation R(c) can be generated by approximating the mathematical average of the high-state nominal curve S+(c) and the low-state nominal curve S−(c).

Figure 3:
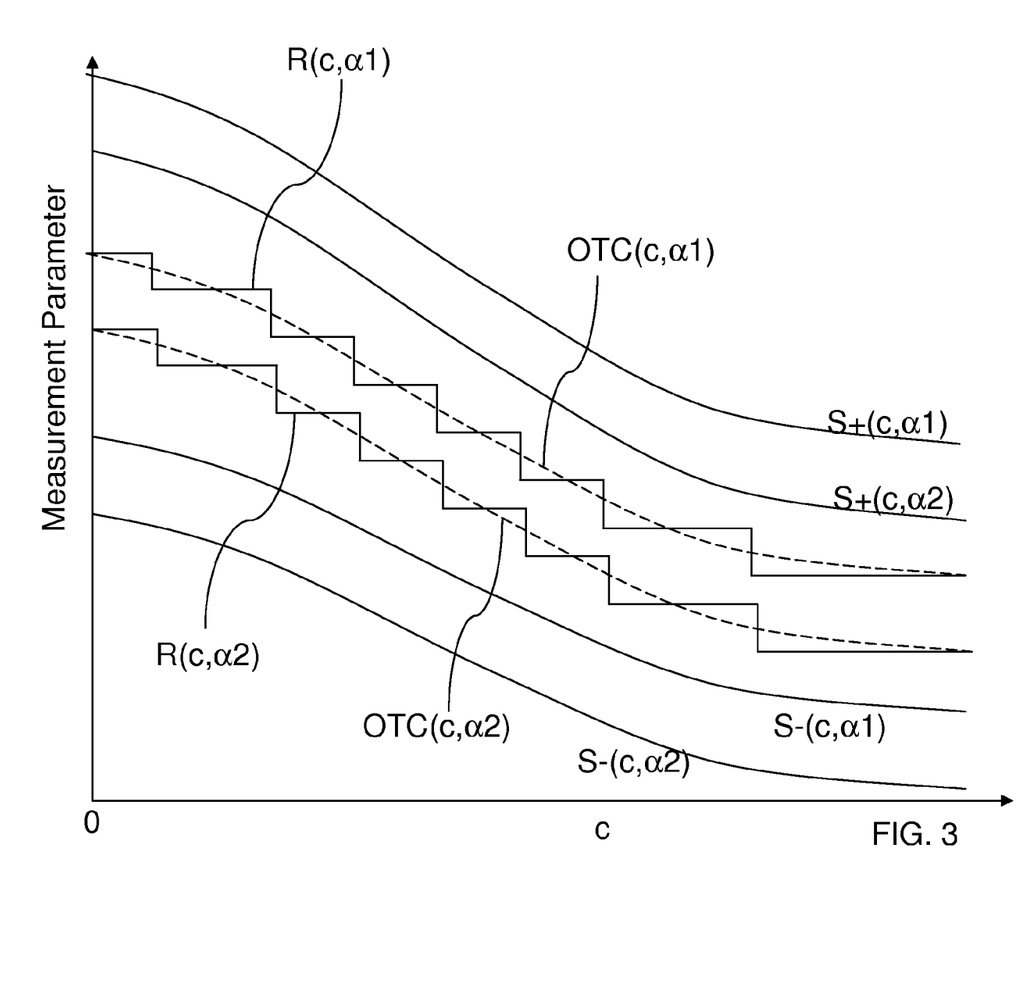
FIG. 3 is an exemplary graph illustrating the cycling dependence of a measurement parameter for a "high" state, a "low" state, an optimal threshold for distinguishing states, and a digitized approximation of the optimal threshold for a plurality of programming conditions as a function of a total number of cycling according to an embodiment of the present disclosure.

Referring to FIG. 3, an embodiment is illustrated in which the distribution of the measured values for the measurement parameter is dependent on at least one programming parameter. As used herein, a "programming parameter" refers to any controllable parameter, i.e., any parameter under control of a user of the memory cell, that can be employed during the encoding of data into a memory cell to affect the distribution of the measurement parameter. A programming parameter can include, for example, a programming voltage employed to program a memory element within the memory cell, a programming current employed to program a memory element within the memory cell, the duration of application of a programming voltage or a programming current, the fraction of times in which a "0" bit value is stored in the memory cell (i.e., the likelihood that the "0" bit value is stored in the memory cell during a given write operation), the fraction of times in which a "1" bit value is stored in the memory cell (i.e., the likelihood that the "1" bit value is stored in the memory cell during a given write operation), the temperature of operation of the memory cell, and/or any other physical parameters that can otherwise systematically affect the distribution of a high-state nominal curve S+(c) and/or the low-state nominal curve S−(c) as illustrated in FIGS. 1A and 1B. In one embodiment, the programming parameter can be a single scalar, or can be a vector that sequentially lists a plurality of controllable parameters that can be employed to affect the distribution of the measurement parameter.

A first high-state nominal curve S+(c, $\alpha 1$) represents the cycling dependence of a nominal value for the measurement parameter of the high state of a memory cell on the number of cycling c for a first programming conditional, which includes a first set of programming parameters. A second high-state nominal curve S+(c, $\alpha 2$) represents the cycling dependence of a nominal value for the measurement parameter of the high state of a memory cell on the number of cycling c for a second programming condition $\alpha 2$, which includes a second set of programming parameters. In one embodiment, each of the first programming condition α1 and the second programming condition α2 can include the fraction of times in which a "0" bit value is stored in the memory cell or the fraction of times in which a "0" bit value is stored in the memory cell. In one embodiment, each of the first programming condition α1 and the second programming condition α2 can include the value of a physical parameter (e.g., a programming voltage or a programming current) that is employed to program (i.e., write on) the memory cell.

A first low-state nominal curve S−(c, α1) represents the cycling dependence of a nominal value for the measurement parameter of the low state of a memory cell on the number of cycling c for a first programming condition α1, which includes a first set of programming parameters. A second low-state nominal curve S−(c, α2) represents the cycling dependence of a nominal value for the measurement parameter of the low state of a memory cell on the number of cycling c for a second programming condition α2, which includes a second set of programming parameters. In one embodiment, each of the first programming condition α1 and the second programming condition α2 can include the fraction of times in which a "0" bit value is stored in the memory cell or the fraction of times in which a "0" bit value is stored in the memory cell. In one embodiment, each of the first programming condition α1 and the second programming condition α2 can include the value of a physical parameter (e.g., a programming voltage or a programming current) that is employed to program (i.e., write on) the memory cell.

While the present disclosure is illustrated employing an embodiment in which two separate curves are shown for each of the high-state nominal curves and the low-state nominal curves, the methods of the present disclosure can be applied to embodiments in which any number of separate curves are generated for the high-state nominal curves and/or for the low-state nominal curves.

Each of the various high-state nominal curves (S+(c, α1), S+(c, α2)) and the low-state nominal curves (S−(c, α1), S−(c, α2)) can be obtained experimentally, i.e., by testing a memory device embodying a plurality of the memory cells and measuring values for the measurement parameter throughout the course of cycling for the plurality of memory cells.

An optimal threshold curve OTC(c, αi, i=1 or 2) is defined for each pair of a high-state nominal curve (S+(c, αi), i=1 or 2) and the corresponding low-state nominal curve (S−(c, αi), i=1 or 2). Each optimal threshold curve OTC(c, αi, i=1 or 2) represents a curve at which the probability to erroneously identify a low state for a high state and the probability to erroneously identify a high state for a low state are equal for the corresponding programming condition αi. Each optimal threshold curve OTC(c, αi, i=1 or 2) is a function of the number of cycling c. Each optimal threshold curve OTC(c, αi, i=1 or 2) can be experimentally determined by comparing the distribution of values of the measurement parameter for the high state and the distribution of values of the measurement parameter for the low state as a function of the number of cycling c.

A digitized approximation R(c, αi, i=1 or 2) of each optimal threshold curve OTC(c, αi, i=1 or 2) can be obtained by segmenting the optical threshold curve OTC(c, αi, i=1 or 2) into multiple portions having a range of variation in the value of the measurement parameter that does not exceed a predefined maximum value for a measurement parameter range in the measurement parameter.

In one embodiment, the predefined maximum value for a measurement parameter range in the measurement parameter can be proportional to the difference in the initial values for a high-state nominal curve (S+(c, αi), i=1 or 2) and the corresponding low-state nominal curve (S−(c, αi), i=1 or 2). In an illustrative example, the predefined maximum value for a measurement parameter range in the measurement parameter can be 1.0% of the difference between the initial value for the high-state nominal curve S+(c, α1) and the initial value for the low-state nominal curve S−(c, α1).

In another embodiment, the predefined maximum value for a measurement parameter range in the measurement parameter can be selected to be the same as, or as an integer multiple of, the smallest change for the measurement parameter that a sensing circuit configured to measure the measurement parameter can detect. For example, if the measurement parameter is a resistance, and if the sensing circuit has a resolution of 1 mΩ, the predefined maximum value for the measurement parameter range can be 1 mΩ or an integer multiple thereof.

For each portion of an optimal threshold curve OTC(c, αi, i=1 or 2) having a range of variation in the value of the measurement parameter and the corresponding range of the number of cycling c, a section of a corresponding digitized approximation R(c, αi, i=1 or 2) corresponding to the same range in the number of cycling c is defined by assigning a value for the measurement parameter to the section of the digitized approximation R(c, αi, i=1 or 2). The assigned value is within the range of variation in the value of the measurement parameter for the corresponding portion of the optimal threshold curve OTC(c, αi, i=1 or 2). Thus, each digitized approximation R(c, αi, i=1 or 2) of the optimal threshold curve OTC(c, αi, i=1 or 2) approximates the optical threshold curve OTC(c, αi, i=1 or 2).

In one embodiment, the entire range of the number of cycling c can be divided into ranges in which each corresponding section of all digitized approximations R(c, αi, i=1 or 2) have a constant value. In another embodiment, the subdivision of the entire range of the number of cycling c into ranges can vary for each digitized approximations R(c, αi, i=1 or 2). In other words, the set of values of the number of cycling c at which the values for the measurement parameter changes may not be the same across the various digitized approximations R(c, αi, i=1 or 2).

A method of the present disclosure can be implemented employing a memory device configured to perform such a method. The memory device can include a set of physical components that perform a method of the present disclosure.

Figure 4A:
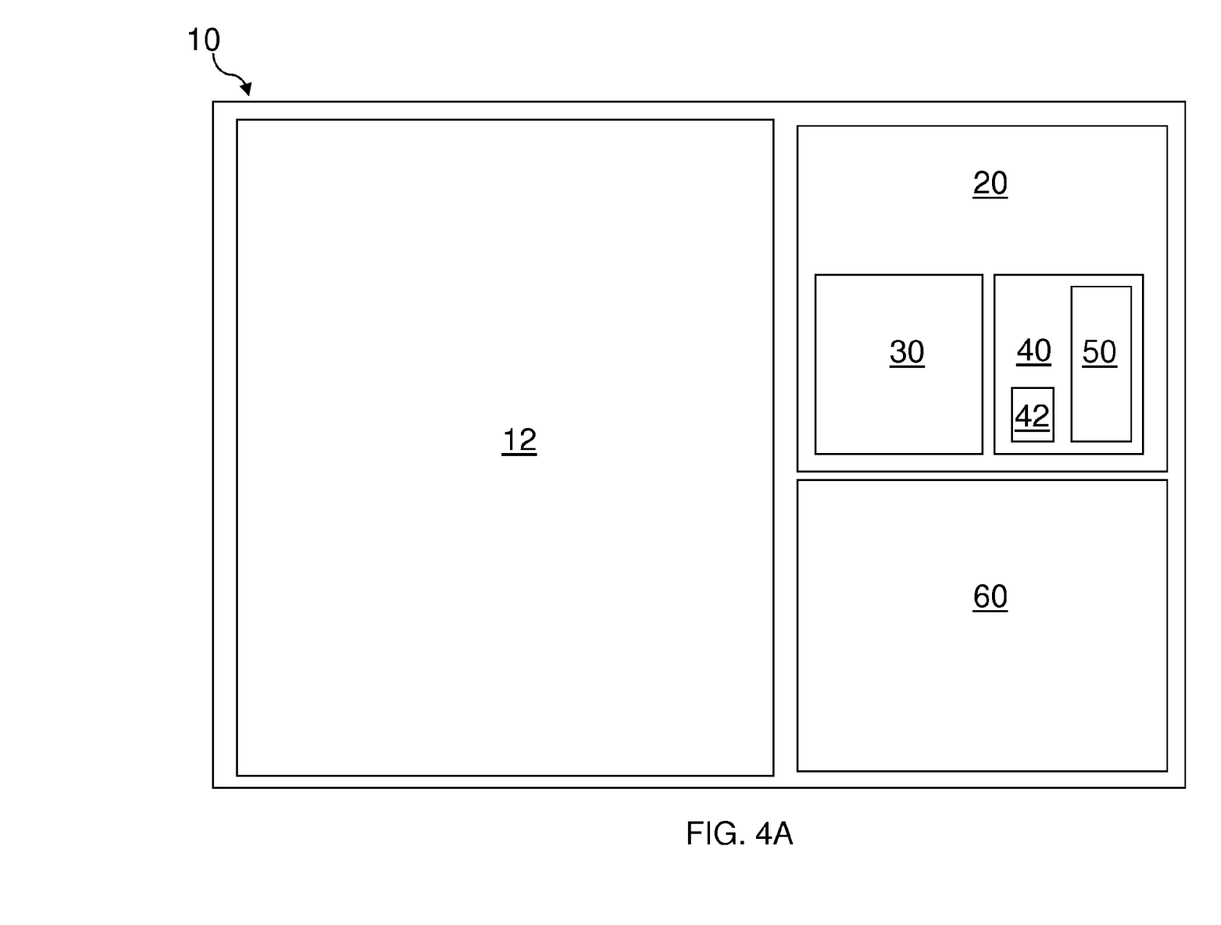
FIG. 4A is a first exemplary memory device according to an embodiment of the present disclosure.
Figure 4B:
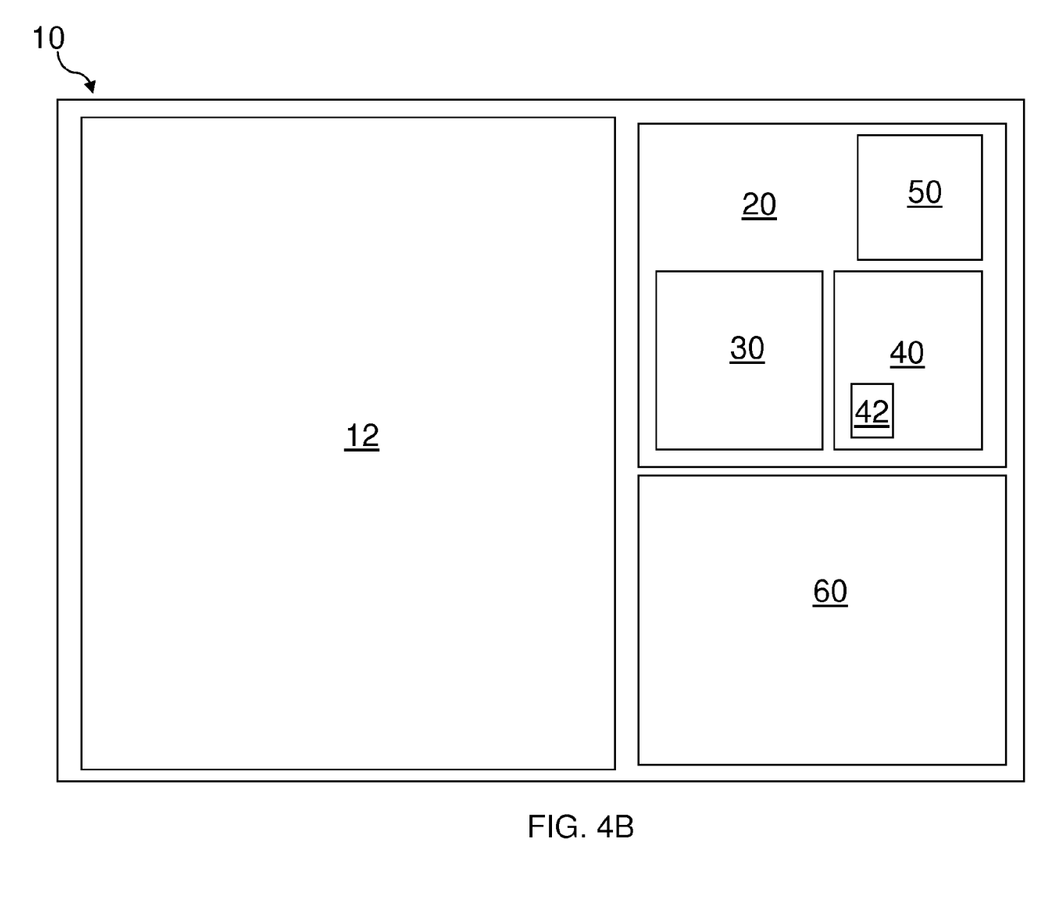
FIG. 4B is a second exemplary memory device according to an embodiment of the present disclosure.

Referring to FIGS. 4A and 4B, a first exemplary memory device and a second exemplary memory device are shown, respectively. Each of the memory devices 10 can include a memory bank 12, a memory controller 20, and a sensing circuit 60. The memory bank 12 includes a plurality of memory cells, each having a memory element that changes a physical property to encode a "0" bit or a "1" bit.

The sensing circuit 60 determines the state of one or more selected memory cells among the plurality of memory cells. The determination of the state of one or more selected memory cells can be performed, for each of the one or more selected memory cells, by comparing a value of a measured quantity from the selected memory cell with a variable reference parameter. The reference parameter can be the measurement parameter having a functional form of the digitized approximation R(c) of FIG. 1A or 1B, or the digitized approximation R(c, αi, i=1 or 2) of FIG. 3.

The memory controller 20 includes at least a control logic block 40 and a look-up table 50. The look-up table 50 can be located within the control logic block 40, or can be located outside the control logic block 40.

The control logic block 40 determines an estimated number of cycling for the plurality of memory cells by counting a total number of cycling for at least one memory cell. In one embodiment, the at least one memory cell can be a single memory cell among the plurality of memory cells in the memory bank 12, and the estimated number of cycling can be the same as the total number of cycling for the single memory cell. In another embodiment, the at least one memory cell can include a predetermined number of memory cells in the memory bank 12 such that the number is in a range from 2 to 128, and the estimated number of cycling can be a statistical quantity derived from a plurality of numbers of total cycling for the predetermined number of memory cells. In one embodiment, the statistical quantity can be a mathematical average, a median, a percentile (such as 25 percentile or a 75 percentile), or a combination thereof. The plurality of numbers of total cycling for the predetermined number of memory cells can be a set of numbers corresponding to the number of cycling of each of the predetermined number of memory cells.

In one embodiment, the memory controller 20 can include a wear leveling circuit 30 as known in the art. The wear leveling circuit 30 randomizes location of data written into the plurality of memory cells in the memory bank 12. In one embodiment, the wear leveling circuit 30 can use the same operational principle as the wear leveling circuit for static areas in a flash memory described in U.S. Pat. No. 6,732,221 to Ban, which was issued on May 4, 2004, the entire contents of which are incorporated herein by reference. In another embodiment, the wear leveling circuit can be the type of circuit described in Kgil et al., Improving NAND flash based disk caches, Proceedings of the 35$^{th}$ Annual International Symposium on Computer Architecture, pp. 327-338, 2008, the entire contents of which are incorporated herein by reference. The wear leveling circuit 30 reduces the variations in the number of cycling within the memory bank 12, so that the estimated number of cycling for the plurality of memory cells by counting a total number of cycling for at least one memory cell is a sufficiently accurate estimate of the overall level of the distribution of the number of cycling for the various memory cells within the memory bank 12.

The look-up table 50 returns a value for the variable reference parameter to the sensing circuit 60 for each value of the total number of cycling provided by the control logic block 40. The look-up table 40 stores encoded data for the value for the variable reference parameter for any positive integer value of the estimated number of cycling. For example, the look-up table 40 can include first encoded memory cells 150 (See FIGS. 5A and 5B) storing a plurality of ranges for the estimated number of cycling, and second encoded memory cells 250 (See FIGS. 5A and 5B) storing a set of values for the variable reference parameter. Each value among the set of values corresponds to a single range among the plurality of ranges for the estimated number of cycling.

Figure 5A:
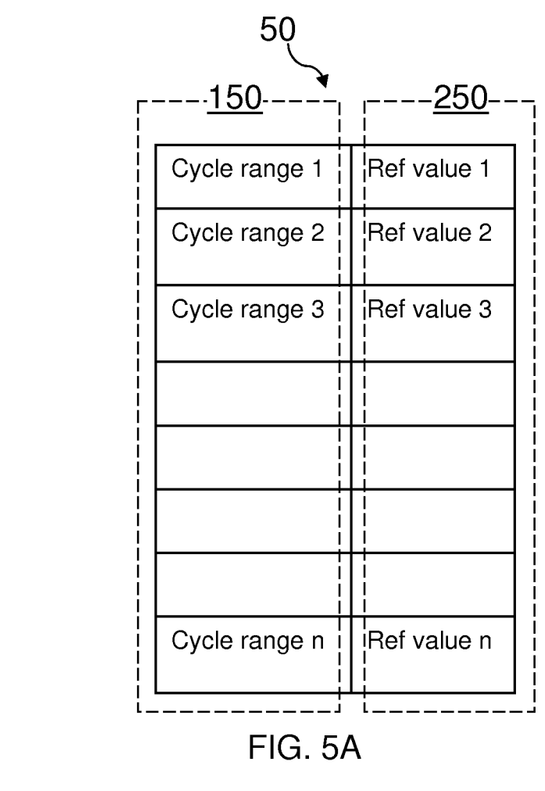
FIG. 5A is a schematic view of a first exemplary look-up table according to an embodiment of the present disclosure.

Referring to FIG. 5A, a first exemplary look-up table 50 is shown. The plurality of ranges for the estimated number of cycling that are stored in the first encoded memory cells 150 can be the set of ranges within the number of cycling c that generates a segment of digitized approximation R(c) having a constant value. The plurality of ranges for the estimated number of cycling and the set of values for the variable reference parameter are a digitized approximation of the optimal threshold curve OTC(c) of FIGS. 1A and 1B, which is a predefined function representing a cycling-dependent shift of a threshold value for the measured quantity for distinguishing a "1" state from a "0" state. In one embodiment, the set of ranges can include the range between 0 and c1 for the value of the number of cycling c, each range between ci and c(i-1) for each positive integer i greater than 1 and less than n for the value of the number of cycling c, and the range corresponding to the values of the number of cycling c that is greater than c(n-1) as illustrated in FIGS. 1A and 1B.

The first encoded memory cells 150 storing the plurality of ranges for the estimated number of cycling can encode the data for "cycle range 1" corresponding to a first range between 0 and c1 for the value of the number of cycling c. For each positive integer i greater than 1 and less than n, the first encoded memory cells 150 storing the plurality of ranges for the estimated number of cycling can encode the data for "cycle range i" corresponding to an i-th range between c(i-1) and ci for the value of the number of cycling c. Further, the first encoded memory cells 150 storing the plurality of ranges for the estimated number of cycling can encode the data for "cycle range n" corresponding to the last range, which is the n-th range, for the value of the number of cycling c. The last range is the range that encompasses all numbers greater than the number c(n-1) for the value of the number of cycling.

The second encoded memory cells 250 storing a plurality of sets of values for the variable reference parameter can encode the data for the first reference value, or "Ref value 1," which corresponds to the first range between 0 and c1 for the value of the number of cycling c, i.e., the "cycle range 1." For each positive integer i greater than 1 and less than n, the second encoded memory cells 250 storing a plurality of sets of values for the variable reference parameter can encode the data for the i-th reference value, or 'Ref value i," which corresponds to the i-th range between c(i-1) and ci for the value of the number of cycling c. Further, the second encoded memory cells 250 storing a plurality of sets of values for the variable reference parameter can encode the data for the last reference value, or "Ref value n," which corresponds to the last range, which is the n-th range, for the value of the number of cycling c.

In one embodiment, the memory bank 12 can be operated in a mode of operation selected from a plurality of modes of operation. Each mode of operation can employ a different programming parameter than any other mode of operation. For example, each mode of operation can employ at least one different programming parameter selected from a programming voltage employed to program a memory element within the memory cell, a programming current employed to program a memory element within the memory cell, the duration of application of a programming voltage or a programming current, the fraction of times in which a "0" bit value is stored in the memory cell (i.e., the likelihood that the "0" bit value is stored in the memory cell during a given write operation), the fraction of times in which a "1" bit value is stored in the memory cell (i.e., the likelihood that the "1" bit value is stored in the memory cell during a given write operation), the temperature of operation of the memory cell, and/or any other physical parameters that can otherwise systematically affect the distribution of a high-state nominal curve (e.g., S+(c, α1) or S+(c, α2)) and/or the low-state nominal curve (e.g., S−(c, α1) or S−(c, α2)) as illustrated in FIG. 3.

Figure 5B:
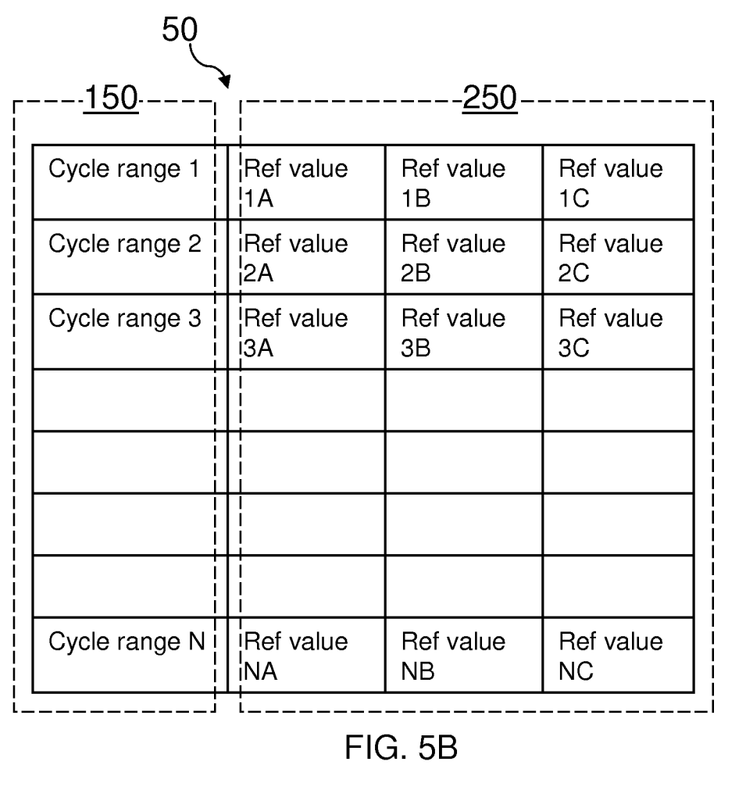
FIG. 5B is a schematic view of a second exemplary look-up table according to an embodiment of the present disclosure.

Referring to FIG. 5B, a second exemplary look-up table 50 is shown. The plurality of ranges for the estimated number of cycling that are stored in the first encoded memory cells 150 can be the set of ranges within the number of cycling c that generates a set of segments of digitized approximations (R(c, α1) and R(c, α2)), each having a constant value within the corresponding segment. The plurality of ranges for the estimated number of cycling and the sets of values for the variable reference parameter are digitized approximation of the optimal threshold curves (OTC(c, α1) and OTC(c, α2)) of FIG. 3, which are predefined functions representing a cycling-dependent shift of a threshold value for the measured quantity for distinguishing a "1" state from a "0" state for each of the programming conditions.

As discussed above, while two programming conditions are illustrated in FIG. 3, any number of programming conditions and the corresponding number of optimal threshold curves and digitized approximations can be generated. Further, the number of columns for the second encoded memory cells 250 can be the same as the number of corresponding programming conditions.

In one embodiment, the look-up table 50 can include first encoded memory cells 150 storing a plurality of ranges for the estimated number of cycling c, and second encoded memory cells 250 storing a plurality of sets of values for the variable reference parameter. Each of the sets corresponds to a mode of operation among the plurality of modes of operation. Each value among the plurality of sets of values corresponds to a single range among the plurality of ranges for the estimated number of cycling c.

The first encoded memory cells 150 storing the plurality of ranges for the estimated number of cycling can encode the data for "cycle range 1" corresponding to a first range for the value of the number of cycling c. For each positive integer i greater than 1 and less than N, the first encoded memory cells 150 storing the plurality of ranges for the estimated number of cycling can encode the data for "cycle range i" corresponding to an i-th range for the value of the number of cycling c. Further, the first encoded memory cells 150 storing the plurality of ranges for the estimated number of cycling can encode the data for "cycle range N" corresponding to the last range, which is the N-th range, for the value of the number of cycling c greater than the largest number of cycling c at which the digitized approximations change. In one embodiment, the set of ranges can include each range for the value of the number of cycling c for which each of the digitized approximations $R(c, \alpha i, i=1$ or $2)$ has a constant value.

The second encoded memory cells 250 storing a plurality of sets of values for the variable reference parameter can encode the data for a first reference value for each mode of operation corresponding to various values of the programming parameter. For example, the first reference value can be "Ref value 1A" for the first value of the programming parameter corresponding to the first mode of operation, "Ref value 1B" for the second value of the programming parameter corresponding to the second mode of operation, and "Ref value 1C" for the third value of the programming parameter corresponding to the third mode of operation.

Likewise, for each positive integer i greater than 1 and not greater than N, the second encoded memory cells 250 storing a plurality of sets of values for the variable reference parameter can encode the data for the i-th reference value for each mode of operation corresponding to various values of the programming parameter. For example, the i-th reference value can be "Ref value iA" for the first value of the programming parameter corresponding to the first mode of operation, "Ref value iB" for the second value of the programming parameter corresponding to the second mode of operation, and "Ref value iC" for the third value of the programming parameter corresponding to the third mode of operation. "N" refers to the total number of ranges for the value of the number of cycling c as defined in a look-up table.

Each column in the second encoded memory cells constitutes a set of values for the variable reference parameter to be supplied to the sensing circuit, and to embody the data in one the digitized approximations ($R(c, \alpha 1)$ and $R(c, \alpha 2)$) (See FIG. 3). Each of the sets corresponds to a mode of operation among the plurality of modes of operation. Each value among the plurality of sets of values corresponds to a single range among the plurality of ranges for the estimated number of cycling c, and to the selected mode of operation.

Referring back to FIGS. 4A and 4B, the control logic block 40 can include a sensing reference mode register 42 that identifies a mode of operation among a plurality of modes of operation for of the plurality of memory cells in the memory back 12. In one embodiment, the control logic block 40 can be configured to identify an operating mode of the memory device among the plurality of modes, and to select a set among the plurality of sets that corresponds to the identified mode of operation to identify the value for the variable reference parameter from the second encoded memory cells 250, i.e., to select the column that corresponds to the identified mode of operation.

In one embodiment, the control logic block 40 can be configured to identify an operating mode among the plurality of modes of operations by calculating a statistical quantify from a sequence of data bits sequentially encoded into the at least one memory cell. The statistical quantities that can be employed to determine an operating mode can be selected from, but are not limited to, a percentage of "1" among data bits sequentially encoded into the at least one memory cell that is monitored by the control logic block 40, a percentage of "0" among data bits sequentially encoded into the at least one memory cell that is monitored by the control logic block 40, and a linear combination thereof. In an illustrative example, if the percentage of "1" among data bits sequentially encoded into the at least one memory cell that is monitored by the control logic block is in a range from 0% to 33.3%, the control logic block can identify the mode of operation as a first operational mode, if the percentage of "1" among data bits sequentially encoded into the at least one memory cell that is monitored by the control logic block is greater than 33.3% and is less than 66.7%, the control logic block can identify the mode of operation as a second operational mode, and if the percentage of "1" among data bits sequentially encoded into the at least one memory cell that is monitored by the control logic block is in a range between 66.7% and 100%, the control logic block can identify the mode of operation as a third operational mode.

In one embodiment, the control logic block 40 can be configured to identify an operating mode among the plurality of modes of operations by monitoring a physical quantity that affects distribution of the measured quantity within the plurality of memory devices. The physical quantities that can be employed to determine an operating mode can be selected from, but are not limited to, a programming voltage employed to program the at least one memory cell, and a programming current employed to program the at least one memory cell.

In one embodiment, the variable reference parameter can be a variable reference voltage, and the measured quantity can be a voltage generated from a measurement on the selected memory cell. In another embodiment, the variable reference parameter can be a variable reference current, and the measured quantity can be a current generated from a measurement on the selected memory cell. In yet another embodiment, the variable reference parameter can be a variable reference timing, and the measured quantity can be a resistance generated from a measurement on the selected memory cell.

In one embodiment, the plurality of memory cells in the memory bank 12 can be a plurality of non-volatile memory cells. The plurality of non-volatile memory cells can be selected from, but is not limited to, a plurality of spin torque transfer random access memory (RAM) elements, a plurality of phase change memory cells, and a plurality of resistive random access memory (RAM) elements.

Figure 6:
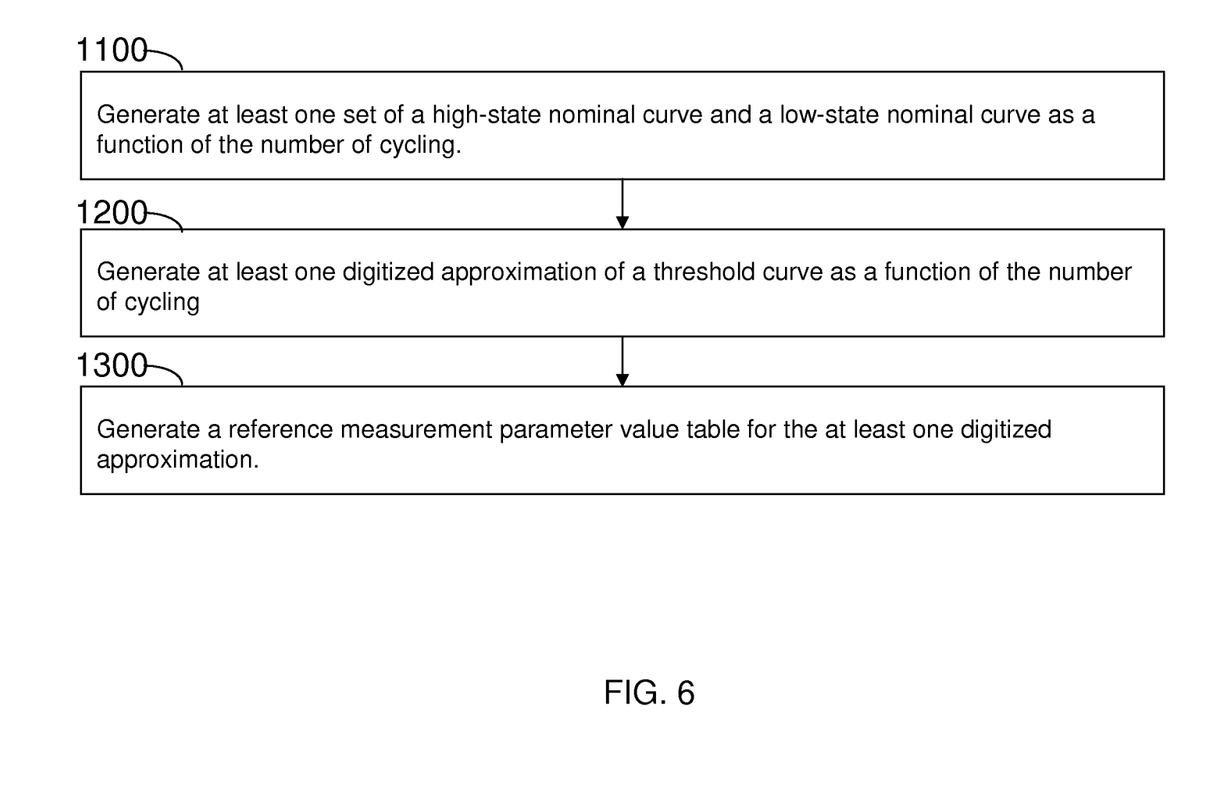
FIG. 6 is a flow chart illustrating a method of generating a look-up table according to an embodiment of the present disclosure.

Referring to FIG. 6, a method of generating a look-up table 50 is illustrated in a flow chart. Referring to step 1100, at least one set of a high-state nominal curve and a low-state nominal curve as a function of the number of cycling c. The at least one set can be a single set of a high-state nominal curve S+(c) and a low-state nominal curve S−(c) as illustrated in FIGS. 1A and 1B. Alternately, the at least one set can be a plurality of K sets corresponding to K modes of operation, which correspond to K different values for the programming parameter. Each of the K sets includes a high-state nominal curve, i.e., S+(c, $\alpha i$) in which the value of i is an integer such that $1 \leq i \leq K$ and $1 < K$, and a low-state nominal curve S−(c, $\alpha i$) as illustrated in FIG. 3. Here, $\alpha i$ represents the i-th programming condition.

Referring to step 1200, at least one digitized approximation of a threshold curve is generated as a function of the number of cycling. The at least one digitized approximation can be a single digitized approximation R(c) as illustrated in FIGS. 1A and 1B. Alternately, the at least one digitized approximation can be K digitized approximations, i.e., a set of R(c, $\alpha i$) in which the value of i can be an integer such that $1 \leq i \leq K$ and $1 < K$ as illustrated in FIG. 3. Each digitized approximation R(c, $\alpha i$) can be generated through an optimal threshold curve OTC(c, $\alpha i$), or can be generated by an approximation of a threshold curve such as a numeral average of a high-state nominal curve S+(c, $\alpha i$) and a low-state nominal curve S−(c, $\alpha i$), i.e., a curve defined by $\{S+(c, \alpha i)+S-(c, \alpha i)\}/2$.

Referring to step 1300, a reference measurement parameter value table, i.e., a look-up table 50, is generated for the at least one digitized approximation employing the methods described above. The look-up table can be embodied in a semiconductor device.

Figure 7:
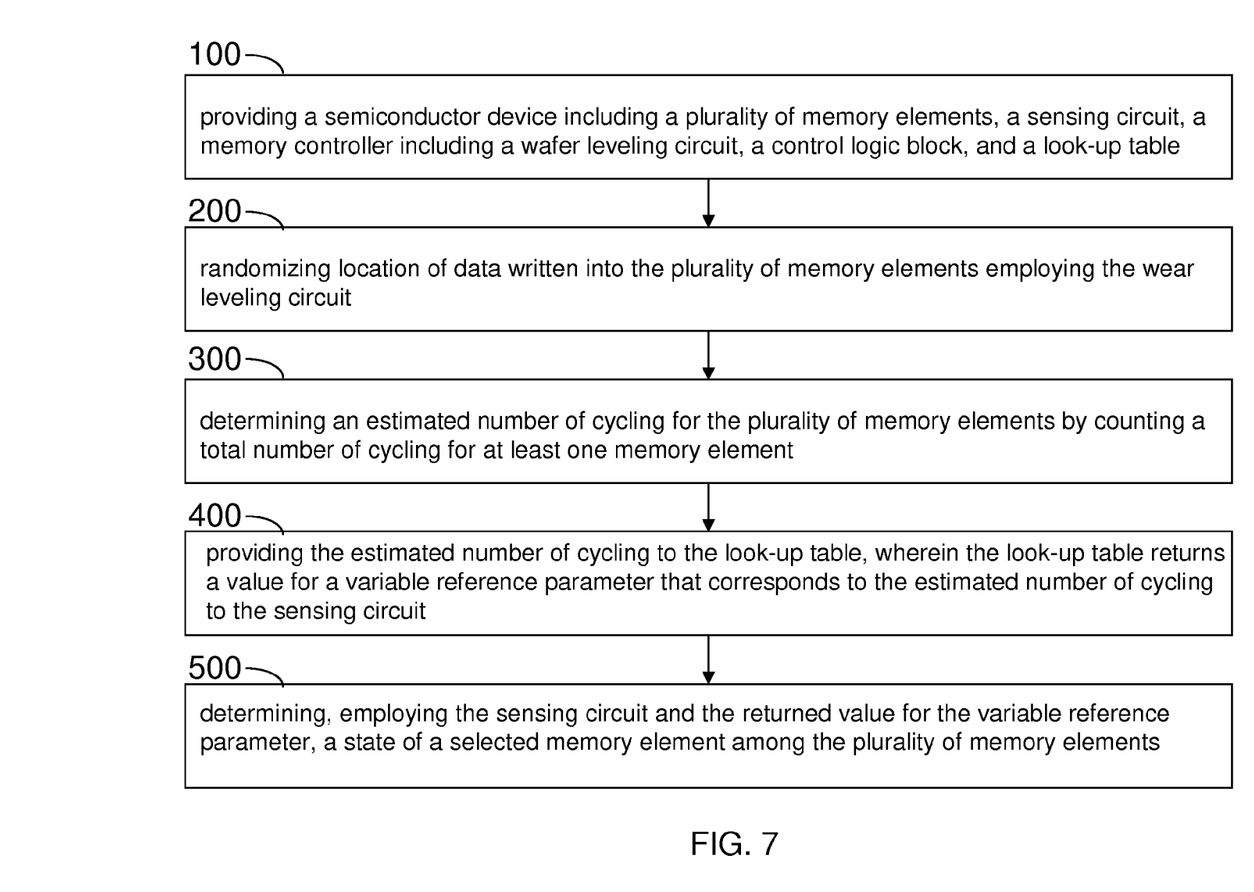
FIG. 7 is another flow chart illustrating a method of operation of the memory device according to an embodiment of the present disclosure.

Referring to FIG. 7, a method of operation of the memory device of embodiments of the present disclosure is illustrated in a flow chart.

Referring to step 100, a memory device 10 including a plurality of memory cells in a memory bank 12, a sensing circuit 60, a memory controller 20 including a wear leveling circuit 30, a control logic block 40, and a look-up table 50 is provided. The memory device 10 can be the same as the memory device 10 illustrated in FIGS. 4A and 4B.

The sensing circuit 60 is configured to compare a value of a measured quantity from the selected memory cell with the variable reference parameter.

Referring to step 200, upon commencement of the usage of the memory device 10, tracking of cycling on at least one memory cell is initiated upon commencement of usage of the memory device 10. Further, the location of data written into the plurality of memory cells is randomized employing the wear leveling circuit 30 during the operation of the memory device 10.

Referring to step 300, an estimated number of cycling for the plurality of memory cells is determined by counting a total number of cycling for at least one memory cell within the memory bank 12.

Referring to step 400, the estimated number of cycling is provided to the look-up table 50. The look-up table 50 returns a value for a variable reference parameter that corresponds to the estimated number of cycling to the sensing circuit 60. In one embodiment, an operating mode among the plurality of modes of operations can be identified with the control logic block 40 by calculating a statistical quantify from a sequence of data bits sequentially encoded into the at least one memory cell. In one embodiment, an operating mode among the plurality of modes of operations can be identified with the control logic block 40 by monitoring a physical quantity that affects distribution of the measured quantity within the plurality of memory devices. Once the operating mode of the memory device is determined among the plurality of modes, a set of values for the variable reference parameter (i.e., a column within the second encoded memory cells 250) can be selected among the plurality of sets (i.e., the columns of the second encoded memory cells 250) that corresponds to the identified mode of operation. Subsequently, the value for the variable reference parameter to be provided to the sensing circuit can be selected from the selected set of values for the variable reference parameter by identifying a value that corresponds to the current number of cycling as determined by the control logic block 40.

Referring to step 500, employing the sensing circuit 60 and the returned value for the variable reference parameter, a state of a selected memory cell among the plurality of memory cells can be determined. Specifically, prior to each sensing cycle, the number of cycling and programming parameters is determined. A corresponding reference measurement parameter value table, e.g., the look-up table 50, is checked. The reference measurement parameter value is adjusted according to the look-up table 50.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of operating a memory device, said method comprising:
    providing a memory device comprising a plurality of memory cells, a sensing circuit, a memory controller comprising a wear leveling circuit, a control logic block, and a look-up table;
    randomizing location of data written into said plurality of memory cells employing said wear leveling circuit, a memory cell subject to plural write cycles applied to that memory cell;
    determining an estimated number of cycling for said plurality of memory cells by counting a total number of cycling for at least one memory cell;
    providing said estimated number of cycling to said look-up table, the look-up table for encoding a relationship between a value of a variable reference parameter associated with a measured physical quantity at said cell and a number of subjected said write cycles to said plurality of memory cells;
    using said look-up table to return a value for a variable reference parameter that corresponds to said estimated number of cycling to said sensing circuit; and
    determining, employing said sensing circuit and said returned value for said variable reference parameter, a state of a selected memory cell among said plurality of memory cells, said state determining including measuring the physical quantity employed in detecting a bit value of the selected memory cell, and comparing, by said sensing circuit, a value of a measured quantity from said selected memory cell with the returned variable reference parameter in the determining of the cell state.

2. The method of claim 1, wherein said memory controller further comprises a wear leveling circuit, and said method further comprises randomizing location of data written into said plurality of memory cells employing said wear leveling circuit.

3. The method of claim 1, wherein said at least one memory cell is a single memory cell among said plurality of memory cells, and said estimated number of cycling is the same as a total number of cycling for said single memory cell.

4. The method of claim 1, wherein said at least one memory cell comprises a predetermined number of memory cells in which said number is in a range from 2 to 128, and said estimated number of cycling is a statistical quantity derived from a number of total cycles corresponding to said predetermined number of memory cells.

5. The method of claim 1, further comprising storing within said look-up table encoded data for said value for said variable reference parameter for any positive integer value of said estimated number of cycling.

6. The method of claim 5, wherein said look-up table comprises:
   first encoded memory cells storing a plurality of ranges for said estimated number of cycling; and
   second encoded memory cells storing a set of values for said variable reference parameter, wherein each value among said set of values corresponds to a single range among said plurality of ranges for said estimated number of cycling.

7. The method of claim 6, wherein said plurality of ranges for said estimated number of cycling and said set of values for said variable reference parameter are a digitized approximation of a predefined function representing a cycling-dependent shift of a threshold value for said measured quantity for distinguishing a "1" state from a "0" state.

8. The method of claim 1, wherein said control logic block comprises a sensing reference mode register that identifies a mode of operation among a plurality of modes of operation of said plurality of memory cells.

9. The method of claim 8, wherein said look-up table comprises:
   first encoded memory cells storing a plurality of ranges for said estimated number of cycling; and
   second encoded memory cells storing a plurality of sets of values for said variable reference parameter, wherein each of said sets corresponds to a mode of operation among said plurality of modes of operation, and each value among said plurality of sets of values corresponds to a single range among said plurality of ranges for said estimated number of cycling.

10. The method of claim 9, further comprising, employing said control logic block, identifying an operating mode among said plurality of modes of operations by calculating a statistical quantify from a sequence of data bits sequentially encoded into said at least one memory cell.

11. The method of claim 10, further comprising:
    selecting said statistical quantity from:
    a percentage of "1" among all data bits sequentially encoded into said at least one memory cell;
    a percentage of "0" among all data bits sequentially encoded into said at least one memory cell; and
    a linear combination thereof.

* * * * *